(12) United States Patent  
Hsu

(10) Patent No.: US 9,109,905 B2
(45) Date of Patent: Aug. 18, 2015

(54) DEVICE LOCATION DETERMINATION

(71) Applicant: George Hsu, Boca Raton, FL (US)

(72) Inventor: George Hsu, Boca Raton, FL (US)

(73) Assignee: PNI Sensor Corporation, Santa Rosa, CA (US)

( * ) Notice: Subject to any disclaimer, the term of this patent is extended or adjusted under 35 U.S.C. 154(b) by 38 days.

(21) Appl. No.: 14/106,724

(22) Filed: Dec. 14, 2013

(65) Prior Publication Data

US 2015/0168153 A1 Jun. 18, 2015

(51) Int. Cl.
| | |
|---|---|
| *G01C 21/20* | (2006.01) |
| *G01C 21/08* | (2006.01) |
| *G01C 23/00* | (2006.01) |
| *G01V 3/08* | (2006.01) |
| *G01R 33/00* | (2006.01) |
| *G01S 19/13* | (2010.01) |
| *G01R 33/02* | (2006.01) |
| *G01V 3/15* | (2006.01) |
| *G01V 3/40* | (2006.01) |
| *G01B 7/00* | (2006.01) |
| *G01C 21/00* | (2006.01) |
| *G01V 3/34* | (2006.01) |
| *G01V 3/36* | (2006.01) |
| *G01C 15/00* | (2006.01) |
| *G01C 19/00* | (2013.01) |

(52) U.S. Cl.
CPC *G01C 21/20* (2013.01); *G01B 7/00* (2013.01); *G01B 7/003* (2013.01); *G01C 15/00* (2013.01); *G01C 19/00* (2013.01); *G01C 21/00* (2013.01); *G01C 21/08* (2013.01); *G01C 21/206* (2013.01); *G01R 33/00* (2013.01); *G01R 33/02* (2013.01); *G01S 19/13* (2013.01); *G01V 3/15* (2013.01); *G01V 3/34* (2013.01); *G01V 3/36* (2013.01); *G01V 3/40* (2013.01); *G01V 2210/142* (2013.01); *G01V 2210/1425* (2013.01)

(58) Field of Classification Search
CPC ............. G01V 3/15; G01V 3/34; G01V 3/36; G01V 3/40; G01V 2210/142; G01V 2210/1425; G01C 19/00; G01C 21/00; G01C 21/08; G01C 21/206; G01C 15/00; G01B 7/00; G01B 7/003
USPC ......... 701/469, 468, 408, 472, 489, 491, 525, 701/300; 324/345, 329; 342/357.39, 342/357.62, 450, 386, 385; 33/355 R
See application file for complete search history.

(56) References Cited

U.S. PATENT DOCUMENTS

| 4,032,758 | A | * | 6/1977 | Lewis | ........................... 701/530 |
| 5,305,212 | A | * | 4/1994 | Kuckes | ........................... 702/7 |
| 5,434,788 | A | * | 7/1995 | Seymour et al. | ............... 701/472 |
| 6,427,122 | B1 | * | 7/2002 | Lin | ................................ 701/472 |
| 6,969,123 | B2 | * | 11/2005 | Vinegar et al. | .................... 299/3 |

(Continued)

FOREIGN PATENT DOCUMENTS

| EP | 20130150083 | 7/2013 |
| EP | 20130150086 | 7/2013 |

*Primary Examiner* — Russell Frejd
(74) *Attorney, Agent, or Firm* — Brian R. Short

(57) ABSTRACT

Methods, apparatuses and systems of estimating a location of a device are disclosed. One method includes determining a first position of the device, sensing at least one magnetic anomaly at the first position, estimating a location of the magnetic anomaly relative to the first position by determining a plurality of magnetic properties of the magnetic anomaly based on sensed signals of at least a magnetic sensor, and estimating a second position of the device based on a sensed change in a distance from the magnetic anomaly to the device.

21 Claims, 6 Drawing Sheets

(56) References Cited

U.S. PATENT DOCUMENTS

| | | | |
|---|---|---|---|
| 7,425,829 B2 * | 9/2008 | Zeller et al. | 324/326 |
| 7,451,549 B1 * | 11/2008 | Sodhi et al. | 33/356 |
| 7,603,251 B1 * | 10/2009 | Wiegert et al. | 702/152 |
| 7,733,077 B1 * | 6/2010 | Merewether et al. | 324/67 |
| 7,834,801 B2 * | 11/2010 | Waite et al. | 342/22 |
| 8,018,382 B2 * | 9/2011 | Shore et al. | 342/386 |
| 8,683,707 B1 * | 4/2014 | Horton, Jr. | 33/355 R |
| 2006/0125644 A1 * | 6/2006 | Sharp | 340/573.1 |
| 2013/0177208 A1 | 7/2013 | Haverinen | |
| 2013/0179074 A1 | 7/2013 | Haverinen | |
| 2013/0179075 A1 | 7/2013 | Haverinen | |
| 2013/0295957 A1 | 11/2013 | Haverinen | |
| 2013/0310069 A1 | 11/2013 | Haverinen | |

* cited by examiner

DEVICE LOCATION DETERMINATION

FIELD OF THE EMBODIMENTS

The described embodiments relate generally to an electronic device. More particularly, the described embodiments relate to location determination of the electronic device.

BACKGROUND

In outdoor environments global positioning systems (GPS) has become the standard in position tracking. The technology has come down in price, size and power consumption to the point that it is incorporated into nearly every mobile communications device. Given data and communication infrastructure and smart phone popularity, mobile applications for use in commerce transactions is a market that has intense interest in being developed. However, most consumer revenue transactions occur in a retail environment that are largely indoors where GPS signals are severely attenuated. This prevents the accurate and pinpoint location tracking of the consumer at the point of purchase and thus severely hinders the revenue sharing opportunities for the broad spectrum of interested parties that have a keen interest in it. Companies in the search engine, payment processing, cellular service provider, handset manufacturer spaces, as well as the retailers themselves are highly motivated to find a solution in order to capitalize on this new and significant source of additional revenue flow.

There are numerous proposed and implemented methods of enabling indoor navigation capability. One method uses radio signals of opportunity, such as WiFi access points that have been spatially pre-mapped within a specific building in order to triangulate the location of the receiving device. This is accomplished by means of measuring the signal strength of an identified WiFi signal and triangulation between two or more such signals to create the common point of intersection of the multiple circles as represented by their respective radii. This same method can also be accomplished by the deliberate placement of Bluetooth or Bluetooth Low Energy beacons for the sole purpose of locating. These aforementioned methods both suffer from reception strength or timing inaccuracies that directly translate into location uncertainty, multi-path errors arising from signal reflections off of radio reflective surfaces indoors, and problems of high water density obstructions (i.e. crowds of people) that absorb and attenuate the signals as well. Another problem with this approach is that it requires costly infrastructure that needs to be paid for and is also laborious when setting up as the indoor reception mapping has to be measured and collected by hand.

Another approach involves replacing the light bulbs and tubes in existing lighting fixtures with ones that can encode digital signals that are invisible to the human eye but that can be decoded by the cameras built into smart phones. This would allow the camera to decode the id of exact fixture under which the device to be tracked currently sits. Again, this suffers from the similar cost burdens of infrastructure build out, mapping labor and also that the system would not function if the phone or tablet remained in the user's pocket where the camera would have an obstructed view to the light fixture. It is worthy to note that most of the value of such indoor tracking systems is not to actually help the owner of the phone to navigate indoors, but in fact to help the companies who are interested in the consumer's location track their position indoors unbeknownst to them, thus enabling such features as push advertising based upon indoor geo-fenced retail boundaries, in other words it's about the money flow and not consumer convenience where the interest truly lies.

Another method relies upon simple dead reckoning using compass and pedometer, but this is also flawed in that the phone has to be held in a known orientation so that the direction of travel can be measured by the phone's compass feature while its accelerometer is configured to count the frequency and approximate stride length during travel. This method suffers from the inaccuracies generated from the magnetic anomalies that greatly intensify indoors and also only works when the user is deliberately using their device to navigate in this manner. Again, this greatly reduces the interest in it by the companies who wish to profit from the user's indoor location.

And finally, there exists an approach by which the entire indoor magnetic field of a building is laboriously mapped a priori (Indoor Atlas) and via a combination of magnetic field map matching and the techniques of dead reckoning described previously, the location of the phone is tracked using the unique spatially located magnetic signatures of the building and less stringent distance of travel information provided by the dead reckoning. This method also suffers from the requirement of laborious a priori mapping of every possible route of travel located within a building, the mapping of the objects and obstructions of the building, the requirement that the device also be used in a fixed position relative to the consumer (i.e. not in the pocket), and also that magnetic fields are not necessarily always singularly unique in each unique part of the building and can change significantly over time (charging and discharging due to natural aging and domain relaxation) via magnetizing events such as a passing subway train that can highly charge ferrous objects in its vicinity based upon the large amounts of electrical currents that flow through its motors and tracks, and finally that objects such as furniture and inventory with their own magnetic signatures may be frequently moved around within the pre-mapped space thereby creating significant sources of error in the pre-mapped data. This last point may rely upon crowd-sourced input to reconfigure the magnetic mapping in close to real time based upon statistical methods as users traverse the mapped routes over the natural course of traffic flow, but this method is untested and can actually create more inaccuracies than it fixes. Except for the two last approaches, all the rest rely upon infrastructure development which is costly and not deployable quickly enough to create any critical mass to truly enable commerce. Also, there will be an ongoing issue of who owns the valuable indoor mapping data and who has access to it based upon who pays for and sets up the mapping infrastructure as well as who owns the real estate where it resides. Issues of intellectual property (the maps) are already being disputed, and this is creating one of the significant challenges to the broad based deployment of indoor navigation and the revenue opportunities resulting from it. Today's indoor navigation solutions currently employ a combination of several of these approaches discussed, but again, all are subject to their own aforementioned weaknesses, both technically and from a business perspective, and their combination only weakly remedies a few of their respective deficiencies.

A traditional navigation grade Inertial Navigation System (INS) would be the best technical solution for the problem of reliable and accurate indoor navigation, except for its size, cost and power consumption. Such an INS would be extremely accurate in tracking position and do so within an earth versus device reference frame, which means that such a device, if it could fit into a pocket, could accurately track its relative movements in three-dimensional space from an initial starting point (set by a last GPS fix immediately prior to entering a shopping center's entrance, for instance) for extended periods of time with great levels of accuracy. And because the tracking is based upon earth reference frame, the attitude of the device relative to its direction of travel does not factor into its ability to track position, so that position tracking from inside a purse or pants pocket would be possible. This is precisely how a consumer would want to use such a device, and is also how companies that want to commercialize indoor navigation would need this capability to work.

Unfortunately, the sensors that are found in today's smart phones do not possess anywhere near the performance necessary to enable true inertial navigation, especially the inertial sensors. The gyroscope, accelerometer and magnetometers that are deployed into today's cell phones optimize around size, cost and power consumption, which are parameters that are diametrically opposed to what is required for inertial navigation. The gyroscopes exhibit bias drift, noise and gain errors that are orders of magnitude greater than what is deployed in a typical INS, while the accelerometers do not have the range, resolution, accuracy, precision, signal to noise ratio and offset stability to do the job either. The magnetometer typically used in a cell phone is also severely degraded in capability with respect to high performance versions that are available on the market but not deployed in handsets. But as an INS often relies solely on its high performance inertial sensors, most do not contain a magnetometer.

In order to determine direction and distance traveled, the gyroscope in a typical INS tracks spatial orientation to within an error envelope of less than 0.1 degrees per hour over full range of dynamic motion, shock, vibration and temperature fluctuations. The INS accelerometers are then used to track distance traveled in any given direction through a double integration of its acceleration output. The problem with such an implementation on cell phone grade inertial sensors is that the gyros used often drift at a rate of a few degrees per minute and the accelerometers contain integration offset errors of a few feet per second. The requirement of a double integration of the accelerometers create two unknown constants of integration that do not remain stable with time or motion and thus the errors accumulated are so large that true displacement signals are completely overwhelmed by the noise introduced by such integration. What is therefore needed is a method to enable the use of non-inertial grade consumer sensors to provide indoor location tracking capabilities in a novel and useful manner.

It is desirable to have a method, system and apparatus for more accurately and inexpensively providing inertial navigation of a mobile device.

SUMMARY

One embodiment includes a method of estimating a location of a device. The method includes determining a first position of the device, sensing at least one magnetic anomaly at the first position, estimating a location of the magnetic anomaly relative to the first position by determining a plurality of magnetic properties of the magnetic anomaly based on sensed signals of at least a magnetic sensor, and estimating a second position of the device based on a sensed change in a distance from the magnetic anomaly to the device.

Another embodiment includes an apparatus. The apparatus includes a magnetic sensor and a controller. At least one of the controller and one or more external controllers are operative to determine a first position of the apparatus, sense at least one magnetic anomaly at the first position, estimate a location of the magnetic anomaly relative to the first position by determining a plurality of magnetic properties of the magnetic anomaly based on sensed signals of at least the magnetic sensor, and estimate a second position of the apparatus based on a sensed change in a distance from the magnetic anomaly to the apparatus.

Other aspects and advantages of the described embodiments will become apparent from the following detailed description, taken in conjunction with the accompanying drawings, illustrating by way of example the principles of the described embodiments.

DETAILED DESCRIPTION

Figure 1:
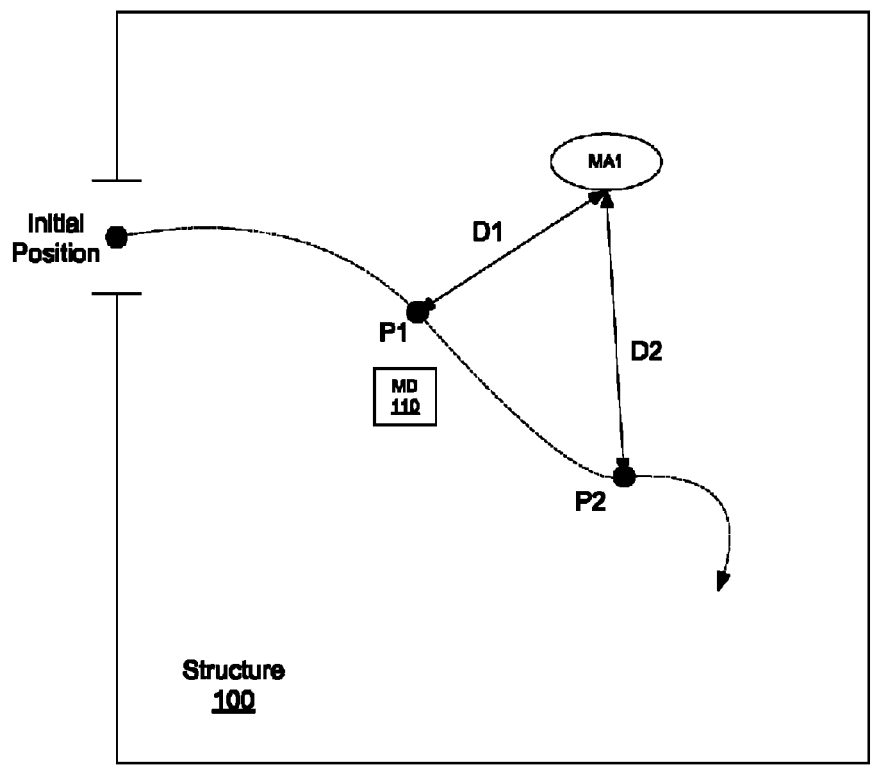
FIG. 1 shows a structure, wherein a mobile device travels within the structure, and one or more locations of the mobile device are determined within the structure, according to an embodiment.

The described embodiments provide indoor navigation systems (INS). More specifically, at least some of the described embodiments provide indoor navigation base at least in part on sensing and utilization of magnetic anomalies located within a structure in which the indoor navigation is being performed. For an embodiment, the magnetic anomalies are utilized as beacons of opportunity which can be themselves utilized for aiding location determination.

As stated, at least some of the described embodiments utilized magnetic anomalies as magnetic distortions of opportunity. In sensor fusion systems (that include, for example, magnetic sensors, accelerometers and a gyroscope), the magnetometer provides absolute heading reference over long time intervals. It is the only non-inertial sensor and in a magnetically clean environment works very well to help the system determine gyro bias drift as well as to establish an absolute orientation reference with respect to the Earth's magnetic field. The disadvantage and difficulty in using magnetic sensors in orientation fusion systems it that they are highly susceptible to magnetic distortions that more often than not, introduce larger errors into the system than if the magnetic sensors weren't used at all.

The most difficult distortion sources to account and correct for are those that are transient in nature, with either the source moving with respect to the system, or where the system is in motion relative to the source. Most often, using magnetics to correct for the system's errors is most readily done in an open and outdoor environment where magnetic distortions typically do not exist in close proximity to the system in use. However, in indoor environments, many magnetic distortion sources exist that can range from ferrous content in furniture and structural elements of a building such as rebar in the floors and i-beams in the walls to electromagnetic fields generated by electrical wires carrying current. It is often so difficult to account for such distortions in indoor environments that the magnetic sensor is simply disabled and not used for its intended purpose.

At least some of the described embodiments utilize the magnetic sensors currently included in most cell phone systems in a manner to correct for inertial sensor deficiencies for the explicit purpose of inertial navigation and self-contained indoor tracking. At least some of the described embodiments use the very source of magnetic errors, magnetic distortions, that are extremely prevalent and ubiquitous in indoor environments as magnetic beacons of opportunity that can provide both the direct measurement of absolute distance and position of the device to be tracked. Its proper deployment can also be cross correlated to the accelerometer-based velocity and distance vectors as determined by the respective first and second integrations of its output in order to calculate and solve for the indeterminate constants of integration as well as to separate translational acceleration from shock generated accelerations.

For at least some of the described embodiments, the anomalies that are traditionally so difficult to deal with, especially indoors, become the unlikely tool to provide reference to a system precisely where and when such reference is needed. The distortion and anomaly sources thus serve to become magnetic beacons, where in combination with the accelerometer and gyroscope outputs, a distance can be calculated to the magnetic sensor from the anomaly by solving for the Maxwell equations of electro magnetism (or more specifically, Gauss's equations of magnetic field strength with respect to distance). The distances to and strength and dipole size of the distortion sources do not need to be known a priori and thus become true beacons of opportunity for use by the described embodiments. Through the combination of the valid part of the accelerometer integrations of velocity and distance, and anticipated solution for Gauss's equations to the magnetic source can be backward calculated, much in the manner of other backward error correction techniques. Once the coefficients for the magnetic equation have been solved, they can be used to determine distance traveled within the radius of the distortion source where the source can still be adequately measured by the magnetic sensor, until the sensitivity floor of the sensor is exceeded (by translational movement), whereby another source can then be picked up and used for the same purpose. Multiple sources can also exist whereby the equation parameters can be solved for them as distinct sources in distinct spatial constellations with respect to each other.

For each source's Gauss's equation, only the dipole size and distance needs to be solved for. Given the number of distinct data points available for input, especially in a moving system, there are enough points to solve for the equations precisely. Different techniques can be used in order to make such equation solving more efficient, and techniques used in adaptive filters, or other approaches such as the Viterbi algorithm can be employed to make the computation more straightforward.

An additional benefit of at least some of the described embodiments is that by using magnetic distortions of opportunity in such a manner, the magnetic transient sources themselves can be better and more accurately characterized thus creating a virtuous feedback loop in better determining when and what fields to use for such beacon positioning. Such a system would be used in conjunction with GPS initializing its starting position (for instance, at the last known position determined at the entrance of a shopping mall, just prior to stepping indoors and losing GPS signal). The described embodiments can be used as a true INS, and track position from magnetic source to magnetic source indoors, where such sources are extremely prevalent and had been very difficult to deal with in the past—categorically having been rejected from use in the past. One can also see that the described embodiments in combination with some of the other existing techniques mentioned previously can constitute even better overall performance in an indoor environment.

FIG. 1 shows a structure 100, wherein a mobile device 110 travels within the structure 100, and one or more locations (P1, P2) of the mobile device 110 are determined within the structure 100, according to an embodiment.

As shown, the mobile device 110 enters the structure 100 at an initial location. As previously described, GPS can be a useful location determination tool while outdoors. However, once indoors the accuracy of GPS can be compromised. The reference location may be, for example, a location in which GPS is still accurate. Therefore, for at least some embodiments, an accurate location determination can be obtained at the reference (initial) location. Further, the mobile device 110 (or another connected controller) can estimate or determine additional (future) positions of the mobile device based in part on the reference or initial location.

As the mobile device 110 travel into the structure 100, the accuracy of the GPS receiver of the mobile device 110 degrades. For an embodiment, the location of a subsequent location, such as location P1, can be estimated based on the reference location, and further based on other sensors of the mobile device 110. For at least some embodiments, the mobile device 110 includes at least an accelerometer, a magnetic sensor and a gyroscope. Distances and displacement can be estimated, for example, based on a double integration of the sensed acceleration signals. Further, the estimates of the distances and displacement can be further refined based on the magnetic sense signal and the gyroscope signal.

As the mobile device 110 travels within the structure 100, at some point, the mobile device will encounter or be opportunistically subjected to the effects of a magnetic anomaly MA1 located within the structure 100. For at least some embodiments, the location P1 is determined as the point of location within the structure 100 in which the mobile device 110 detects the presence of the magnetic anomaly MA1. As previously described, in indoor environments, many magnetic distortion sources (such as, magnetic anomaly MA1) exist that can range from ferrous content in furniture and structural elements of a building such as rebar in the floors and i-beams in the walls to electromagnetic fields generated by electrical wires carrying current. Further, as previously described, magnetic anomalies that are traditionally so difficult to deal with, especially indoors, become the unlikely tool to provide reference to a system precisely where and when such reference is needed. The distortion and anomaly sources thus serve to become magnetic beacons, where in combination with the accelerometer and gyroscope outputs, a distance can be calculated between the magnetic sensor (of the mobile device 110) from the anomaly by solving for the Maxwell equations of electro magnetism (or more specifically, Gauss's equations of magnetic field strength with respect to distance).

For at least some embodiments, the magnetic anomaly MA1 is sensed by the sensors of the mobile device 110. For an embodiment, the magnetic anomaly MA1 is sensed by a magnetic sensor of the mobile device 110 sensing a perturbation of sensed earth magnetic vector (magnitude). For another embodiment, the magnetic anomaly MA1 is sensed by the magnetic sensor and an accelerometer of the mobile device 110 sensing a perturbation of dip angle between a sensed earth magnetic vector and a sensed gravity vector. For an embodiment, the magnetic anomaly MA1 is sensed by the magnetic sensor, the accelerometer, and a gyroscope of the mobile device 110 sensing a perturbation of a rotation of a sensed earth magnetic vector about an axis of a sensed gravity vector.

Once the magnetic anomaly at location P1 has been sensed, the location of the mobile device 110 at the location P1 is estimated. As described, for an embodiment, the first position P1 is determined based on the initial or reference position. For an embodiment, the location of the initial or reference position is based on a location determined by a GPS receiver of the mobile device. As described, for an embodiment, the first position is determined based on the location of the initial position and further based on the sensed signals. For an embodiment, the location of the first position is determined by the GPS receiver. For other embodiments, the location of the first position is determined based on the GPS receive at the initial location, and additionally determined based on one or more other sensor devices (accelerometer, magnetic sensor, gyroscope).

Once the magnetic anomaly at location P1 has been sensed, at least some embodiments include estimating a location of the magnetic anomaly MA1 relative to the first position by determining a plurality of magnetic properties of the magnetic anomaly based on sensed signals of at least a magnetic sensor. For an embodiment, this includes determining at least a distance D1 between the mobile device 110 at the location P1 and the location of the magnetic anomaly MA1. For at least some embodiments, the plurality of magnetic properties of the magnetic anomaly includes a size of a dipole associated with the magnetic anomaly, an intensity of the dipole, and the distance between the mobile device at the first position and the magnetic anomaly.

Figure 5:
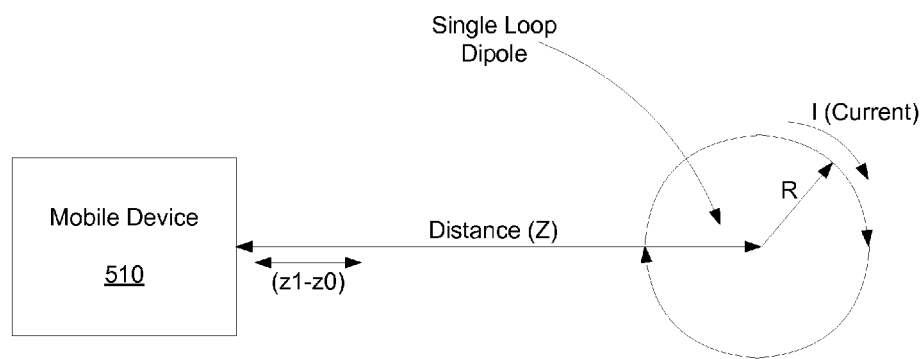
FIG. 5 show a single loop magnetic dipole, according to an embodiment.

As will be shown in FIG. 5, the magnetic field B provided by a magnetic dipole (for example, a single loop dipole) can be determined utilizing Gauss's equation as:

$$B_z = \frac{\mu_0 I}{2} \cdot \frac{R^2}{(z^2 + R^2)^{3/2}}$$

The magnetic field strength B can be measured by the magnetic sensor of the mobile device while the mobile device deviates slightly along the z axis relative to the magnetic dipole. That is, a deviation in B can be determined for a deviation in z. The current I flowing single loop dipole can be assumed to be constant. Therefore, the value of R, the radius of the single loop dipole can be determined. Once the radius R has been determined, the value of the current I can be determined. The radius R provides a representation of the size of the dipole and the value of the current I provides a representation of the intensity of the dipole.

For at least some embodiments, magnetic equations (such as, Maxwell's equations, or Guass's equations) are solved for determining the size, intensity of the dipole, and distance of the dipole.

Having determined the location of the first position P1, and the magnetic properties of the magnetic anomaly MA1, locations of additional positions (such as, the location of position P2) can be estimated. For at least some embodiments, this includes determining the distance D2 between the mobile device 110 at the position P2 and the location of the magnetic anomaly MA1. For at least some embodiments, the additional positions are estimated based on a sensed change in a distance from the magnetic anomaly to the device. That is, by knowing the location of the first position P1, the location of the second position P2 can be estimated based on the plurality of magnetic properties of the magnetic anomaly MA1. More specifically, for an embodiment, a distance between the mobile device 110 and the magnetic anomaly MA1 is calculated at the second position P2 while assuming the size of the dipole associated with the magnetic anomaly and the intensity of the dipole are constant for at least a temporal period.

Figure 2:
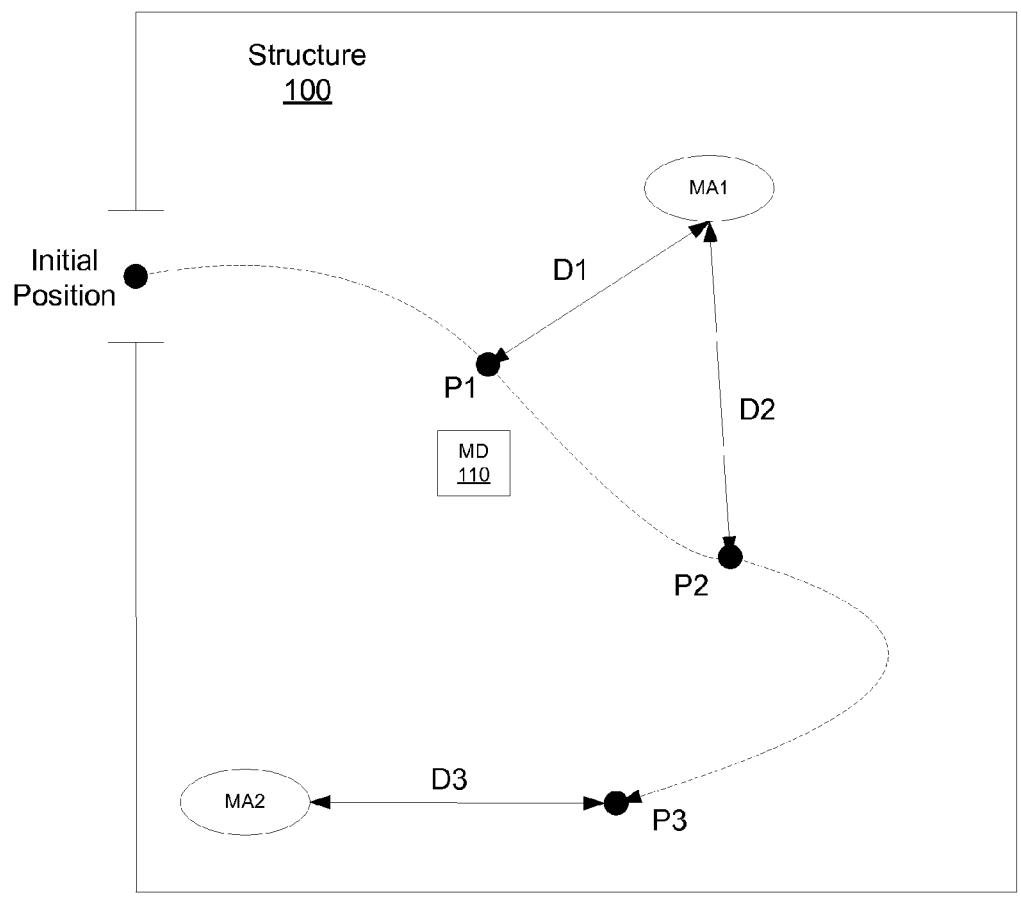
FIG. 2 shows a structure, wherein a mobile device travels within the structure, and one or more locations of the mobile device are determined within the structure, according to another embodiment.

FIG. 2 shows a structure, wherein a mobile device 110 travels within the structure 100, and one or more locations of the mobile device 110 are determined within the structure 100, according to another embodiment. As shown, as the mobile device 110 additionally travels within the structure 100, additional or new magnetic anomalies (such as, MA2) will be encountered.

For an embodiment, the mobile device continues to estimate its position based on the first magnetic anomaly until a new magnetic anomaly is sensed to have a greater effect on the magnetic device. Various methods can be used to determine the effects of each magnetic anomaly and to estimate the effects of each magnetic anomaly on the mobile device.

Once the new magnetic anomaly is sensed, the position P3 of the mobile device 110 is estimated. Similar to prior discussions, the location of the third position P3 can be estimated based on the estimated distance change from P2, and/or based on the estimated location of P2 and the sensed signals of the sensors of the mobile device 110. Further, the distance D3 between the mobile device 110 and the magnetic anomaly MA2 is estimated. Similar to prior discussions, for at least some embodiments, the distance between the third position P3 and the magnetic anomaly MA2 is determined based on a plurality of magnetic properties of the magnetic anomaly MA2 based on sensed signals of at least a magnetic sensor. For at least some embodiments, the plurality of properties of the magnetic anomaly includes a size of a dipole associated with the magnetic anomaly, an intensity of the dipole, and the distance between the mobile device at the first position and the magnetic anomaly.

Once the location of the mobile device 110 at the position P3 is determined, for at least some embodiments, the additional positions are estimated based on a sensed change in a distance from the magnetic anomaly MA2 to the device 110. That is, by knowing the location of the third position P3, the location of the additional or future positions can be estimated based on the plurality of magnetic properties of the magnetic anomaly MA2. More specifically, for an embodiment, a distance between the mobile device 110 and the magnetic anomaly MA2 is calculated at the future or additional positions while assuming the size of the dipole associated with the magnetic anomaly MA2 and the intensity of the dipole are constant for at least a selected temporal period.

Figure 3:
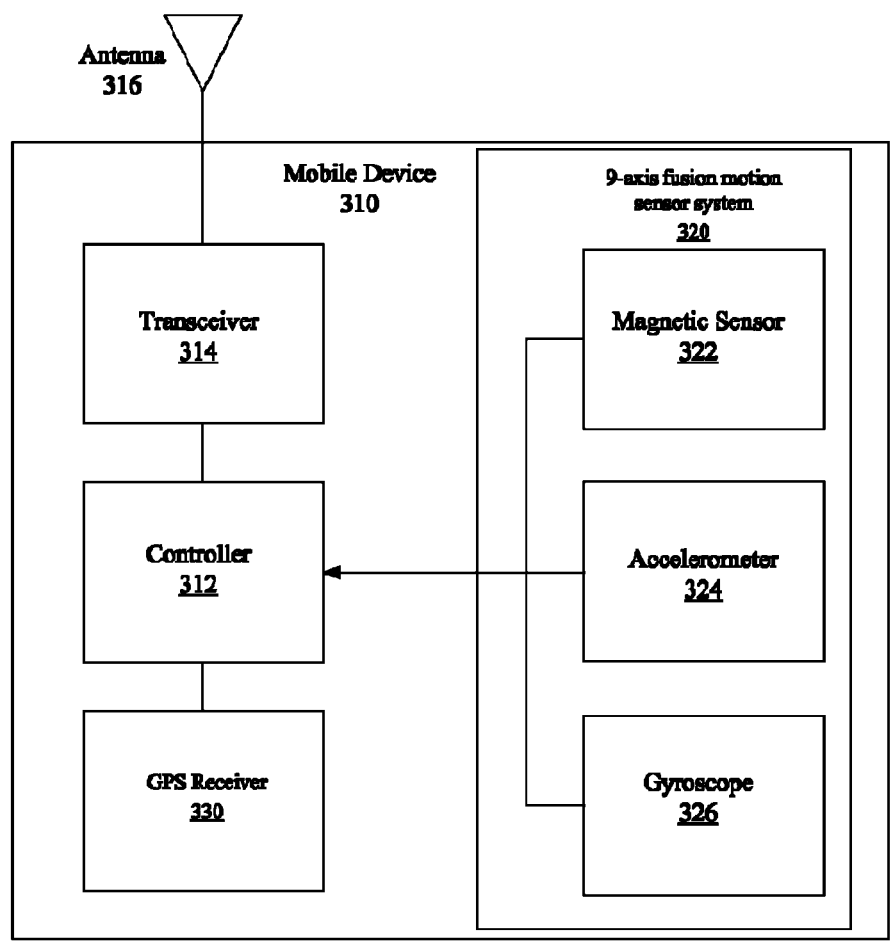
FIG. 3 shows an embodiment of a mobile device, according to an embodiment.

FIG. 3 shows an embodiment of a mobile device 310, according to an embodiment. As shown, for at least some embodiments, the mobile device 310 includes a controller 312, a transceiver 314, an antenna 316, a magnetic sensor 322, an accelerometer 324, and a gyroscope 326. For an embodiment, the magnetic sensor 322, the accelerometer 324, and the gyroscope 326 are a part of a 9-axis fusion motion sensor system 320. Further, for an embodiment, the mobile device 310 includes a GPS receiver 330.

By utilizing the 9-axis fusion motion sensor system 320 electromagnetic interference that can plague compass measurements can be compensated by the gyro, and the gyro itself, which suffers from drift over time, can be corrected by the accelerometer, which in turn will need boost from the other two sensors, since it is better with slower, rather than swift movements.

For an embodiment, the GPS receiver provides the location of the initial or reference position of the mobile device 310.

The sensors (the magnetic sensor 322, the accelerometer 324, and the gyroscope 326) provide the sense signals for determining a first position P1 of the mobile device 310, sensing at least one magnetic anomaly MA1 at the first position P1. In conjunction with the sensed signals, the controller 312 is operative to estimating a location of the magnetic anomaly MA1 relative to the first position P1 by determining a plurality of magnetic properties of the magnetic anomaly MA1 based on sensed signals of at least a magnetic sensor, and estimate a second position P2 of the mobile device 310 based on a sensed change in a distance from the magnetic anomaly MA1 to the mobile device 310.

Figure 4:
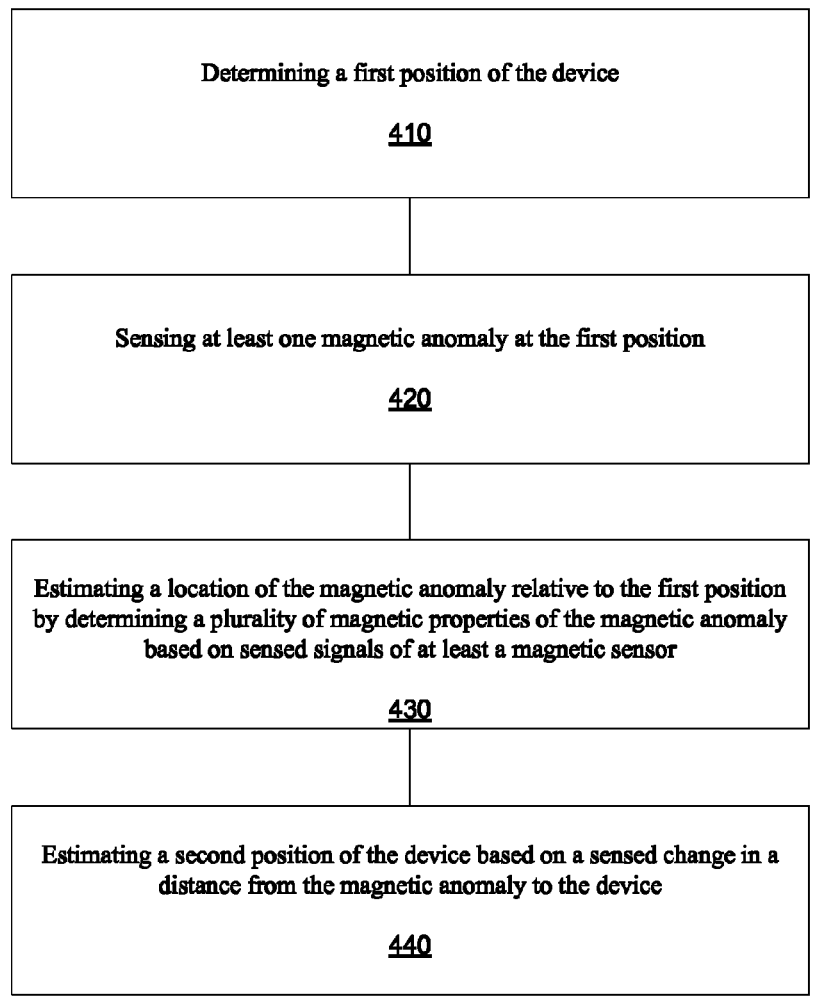
FIG. 4 is a flow chart that includes steps of a method of determining a location of a mobile device, according to an embodiment.

FIG. 4 is a flow chart that includes steps of a method of estimating a location of a device, according to an embodiment. A first step 410 includes determining a first position of the device. A second step 420 includes sensing at least one magnetic anomaly at the first position. A third step 430 includes estimating a location of the magnetic anomaly relative to the first position by determining a plurality of magnetic properties of the magnetic anomaly based on sensed signals of at least a magnetic sensor. A fourth step 440 includes estimating a second position of the device based on a sensed change in a distance from the magnetic anomaly to the device.

For at least some embodiments, the plurality of magnetic properties of the magnetic anomaly is based on sensed signals of at least the magnetic sensor, an accelerometer, and a gyro.

At least some embodiments further include estimating additional positions of the mobile device based on additional sensing of changes in the distance of the magnetic anomaly to the mobile device.

As previously described, for at least some embodiments, the determination of the first position is based on a location of an initial position. For an embodiment, the location of the initial position is based on a GPS receiver of the mobile device. Further, the location of the first position is determined based on the initial position, and based on the sensed signals. For an embodiment, the first position is determined based on sensing of the magnetic anomaly. Therefore, the first position and the initial position can be at the same location, or the initial position and the first position can be separated by a distance. If separated, the difference in location between the initial position and the first position can be estimated based on the location of the initial position, and supplemented by the sensed signals.

For at least some embodiments, the at least one magnetic anomaly is sensed by sensing a perturbation of sensed earth magnetic vector. For at least some embodiments, the at least one magnetic anomaly is sensed by sensing a perturbation of dip angle between a sensed earth magnetic vector and a sensed gravity vector. For at least some embodiments, the at least one magnetic anomaly is sensed by sensing a perturbation of a rotation of a sensed earth magnetic vector about an axis of a sensed gravity vector.

For at least some embodiments, determining the plurality of magnetic properties of the magnetic anomaly includes determining a size of a dipole associated with the magnetic anomaly, determining an intensity of the dipole, and determining the distance between the mobile device at the first position and the magnetic anomaly.

For at least some embodiments, one or more magnetic equations, such as, Maxwell's equations, Gauss's equation or are solved for determining the size, intensity of the dipole;

and distance of the dipole. For example, as previously described, Gauss's equation provides that:

$$B_z = \frac{\mu_0 I}{2} \cdot \frac{R^2}{(z^2 + R^2)^{3/2}}$$

FIG. 5 show a magnetic dipole, according to an embodiment. The magnetic dipole of FIG. 5 is a single loop magnetic dipole, with a current I flowing through the single loop, which generates a magnetic field B (not shown). The mobile device 510 includes a magnetic sensor that measures the magnetic field B while the mobile device 510 deviates slightly (say 1 meter) along an axis defined by a distance z1-z0. That is, a delta B can be characterized for a delta z.

As The current I flowing single loop dipole can be assumed to be constant. Therefore, the value of R, the radius of the single loop dipole can be estimated. Once the radius R has been estimated, the value of the current I can be estimated. The radius R provides a representation of the size of the dipole, and the value of the current I provides a representation of the intensity of the dipole.

For at least some embodiments, estimating the location of the second position includes sensing the magnetic anomaly, and calculating a distance between the mobile device and the magnetic anomaly while assuming the size of the dipole associated with the magnetic anomaly and the intensity of the dipole are constant for at least a temporal period.

Figure 6:
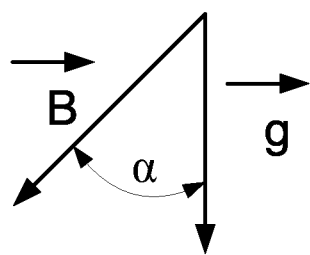
FIG. 6 shows sensed earth magnetic vectors and sensed gravity vectors, according to an embodiment.
Figure 6:
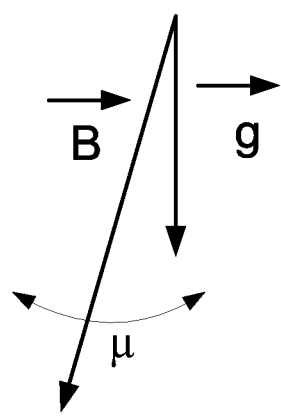

FIG. 6 shows sensed earth magnetic vectors and sensed gravity vectors, according to an embodiment. As previously described, for at least some embodiments, the magnetic anomaly is sensed by sensing a perturbation of sensed earth magnetic vector. That is, as shown, a perturbation or deviation in the magnitude of the B vector which represents the earth's magnetic field is sensed, for example, by a magnetic sensor of the device 110. For at least some embodiments, magnetic anomaly is sensed by sensing a perturbation of dip angle between a sensed earth magnetic vector and a sensed gravity vector. The dip angle is the angle α between the B vector and a g vector which represents the earth's gravity. The dip angle can be sensed and monitored by the magnetic sensor and the accelerometer of the device 110. For at least some embodiments, the at least one magnetic anomaly is sensed by sensing a perturbation of a rotation of a sensed earth magnetic vector about an axis of a sensed gravity vector. The rotation μ of the sensed earth magnetic vector B about the axis of the sensed gravity vector g can be sensed by a gyroscope of the device 110.

Although specific embodiments have been described and illustrated, the described embodiments are not to be limited to the specific forms or arrangements of parts so described and illustrated. The embodiments are limited only by the appended claims.

What is claimed:

1. A method of estimating a location of a device, comprising;
   determining a first position of the device;
   sensing at least one magnetic anomaly at the first position;
   estimating a location of the magnetic anomaly relative to the first position by determining a plurality of magnetic properties of the magnetic anomaly based on sensed signals of at least a magnetic sensor; and
   estimating a second position of the device based on a sensed change in a distance from the magnetic anomaly to the device.

2. The method of claim 1, wherein the plurality of magnetic properties of the magnetic anomaly is based on sensed signals of at least the magnetic sensor, an accelerometer, and a gyro.

3. The method of claim 1, further comprising estimating additional positions of the mobile device based on additional sensing of changes in the distance of the magnetic anomaly to the mobile device.

4. The method of claim 1, wherein determining the first position comprises determining an initial position.

5. The method of claim 4, further comprising determining the initial position based on a GPS receiver of the mobile device.

6. The method of claim 1, wherein determining the first position comprises determining an initial position, and determining the first position based on the initial position and based on the sensed signals.

7. The method of claim 6, comprising determining a location of the first position based on a location of the initial position, and the sensed signals.

8. The method of claim 1, wherein sensing the at least one magnetic anomaly comprises sensing a perturbation of a sensed earth magnetic vector.

9. The method of claim 1, wherein sensing the at least one magnetic anomaly comprises sensing a perturbation of dip angle between a sensed earth magnetic vector and a sensed gravity vector.

10. The method of claim 1, wherein sensing the at least one magnetic anomaly comprises sensing a perturbation of a rotation of a sensed earth magnetic vector about an axis of a sensed gravity vector.

11. The method of claim 1, wherein determining the plurality of magnetic properties of the magnetic anomaly comprises:
   determining a size of a dipole associated with the magnetic anomaly;
   determining an intensity of the dipole; and
   determining the distance between the mobile device at the first position and the magnetic anomaly.

12. The method of claim 11, wherein one or more magnetic equations are solved for determining the size, intensity of the dipole; and distance of the dipole.

13. The method of claim 1, wherein estimating the location of the second position comprises:
   sensing the magnetic anomaly;
   calculating a distance between the mobile device and the magnetic anomaly while assuming the size of the dipole associated with the magnetic anomaly and the intensity of the dipole are constant for at least a selected temporal period.

14. An apparatus, comprising;
   a magnetic sensor;
   a controller, wherein at least one of the controller and one or more external controllers are operative to:
   determine a first position of the apparatus;
   sense at least one magnetic anomaly at the first position;
   estimate a location of the magnetic anomaly relative to the first position by determining a plurality of magnetic properties of the magnetic anomaly based on sensed signals of at least the magnetic sensor; and
   estimate a second position of the apparatus based on a sensed change in a distance from the magnetic anomaly to the apparatus.

15. The apparatus of claim 14, further comprising an accelerometer and a gyro, and wherein the plurality of magnetic properties of the magnetic anomaly is based on sensed signals of at least the magnetic sensor, the accelerometer, and the gyro.

16. The apparatus of claim 14, wherein the at least one of the controller and one or more external controllers are further operative to:
   estimate additional positions of the apparatus based on additional sensing of changes in the distance of the magnetic anomaly to the apparatus.

17. The apparatus of claim 14, wherein determining the first position comprises determining an initial position, and determining the first position based on the initial position and based on the sensed signals.

18. The apparatus of claim 14, wherein sensing the at least one magnetic anomaly comprises sensing a perturbation of a sensed earth magnetic vector.

19. The apparatus of claim 14, wherein sensing the at least one magnetic anomaly comprises sensing a perturbation of dip angle between a sensed earth magnetic vector and a sensed gravity vector.

20. The apparatus of claim 14, wherein sensing the at least one magnetic anomaly comprises sensing a perturbation of a rotation of a sensed earth magnetic vector about an axis of a sensed gravity vector.

21. The apparatus of claim 14, wherein determining the plurality of magnetic properties of the magnetic anomaly comprises:
   determining a size of a dipole associated with the magnetic anomaly;
   determining an intensity of the dipole; and
   determining the distance between the mobile device at the first position and the magnetic anomaly.

* * * * *